(12) United States Patent
Filipovic

(10) Patent No.: US 8,892,402 B2
(45) Date of Patent: Nov. 18, 2014

(54) METHOD AND APPARATUS TO PROVIDE A DATA INTERFACE BETWEEN EQUIPMENT TO BE TEMPORARILY MONITORED AND DIAGNOSTIC DATA GATHERING APPARATUS

(75) Inventor: Dragan Filipovic, Arlington Heights, IL (US)

(73) Assignee: Intercontinental Great Brands LLC, East Hanover, NJ (US)

( * ) Notice: Subject to any disclaimer, the term of this patent is extended or adjusted under 35 U.S.C. 154(b) by 1356 days.

(21) Appl. No.: 11/965,852

(22) Filed: Dec. 28, 2007

(65) Prior Publication Data
US 2009/0171624 A1    Jul. 2, 2009

(51) Int. Cl.
*H05K 7/14*    (2006.01)
*G05B 23/02*    (2006.01)

(52) U.S. Cl.
CPC .......... *G05B 23/0213* (2013.01); *H05K 7/1481* (2013.01)
USPC ........................................................ 702/182

(58) Field of Classification Search
CPC .................................................... H05K 7/1481
USPC ............................................ 702/182, 183, 188
See application file for complete search history.

(56) References Cited

U.S. PATENT DOCUMENTS

| | | | |
|---|---|---|---|
| 4,783,700 A * | 11/1988 | Nagane | 358/482 |
| 4,996,655 A | 2/1991 | Chadwick et al. | |
| 5,103,917 A * | 4/1992 | Moore | 172/6 |
| 5,115,325 A * | 5/1992 | Kallin et al. | 358/406 |
| 5,772,861 A * | 6/1998 | Meredith et al. | 204/298.03 |
| 6,012,855 A | 1/2000 | Hahn | |
| 6,240,471 B1 | 5/2001 | Schlueter et al. | |
| 6,243,350 B1 | 6/2001 | Knight et al. | |
| 6,378,687 B1 * | 4/2002 | Lem et al. | 198/349.95 |
| 6,553,437 B1 * | 4/2003 | Aswell et al. | 710/36 |
| 6,611,724 B1 | 8/2003 | Buda et al. | |

(Continued)

FOREIGN PATENT DOCUMENTS

| | | |
|---|---|---|
| DE | 43 20 403 | 12/1994 |
| EP | 0 291 784 | 11/1988 |

(Continued)

OTHER PUBLICATIONS

European Search Report Dated Mar. 25, 2009 from European Patent Application No. EP 08 16 9080.

(Continued)

*Primary Examiner* — Bryan Bui
(74) *Attorney, Agent, or Firm* — Fitch, Even, Tabin & Flannery LLP

(57) ABSTRACT

A channel (500) is configured and arranged to be fixedly mounted (401) to equipment (100) to be temporarily monitored. At least one sensor-engagement member (800) is movably captivated (402) within this channel and a sensor assembly (1000), comprising a plurality of photosensitive receptors (1001) that are disposed in a pattern that corresponds to signal lights as comprise a part of the monitored equipment, is biased (404) towards the sensor-engagement member by an affixment member (1200) to thereby retain the sensor assembly in place with respect to the monitored equipment. By this approach, the sensor assembly, in combination with the sensor-engagement member, can be moved (403) along the channel to a selected position with respect to at least one of the signals lights and then retained in that selected position by the affixment member.

21 Claims, 5 Drawing Sheets

(56) References Cited

U.S. PATENT DOCUMENTS

| | | | |
|---|---|---|---|
| 6,906,315 B2 * | 6/2005 | Tobiason | 250/237 R |
| 7,483,730 B2 * | 1/2009 | Diab et al. | 600/344 |
| 2002/0080468 A1 * | 6/2002 | Crummey et al. | 359/325 |
| 2002/0087578 A1 | 7/2002 | Vroman | |
| 2002/0170073 A1 * | 11/2002 | Miller et al. | 725/139 |
| 2003/0125890 A1 | 7/2003 | Nagamatsu | |
| 2004/0052446 A1 * | 3/2004 | Gan et al. | 385/15 |
| 2004/0106211 A1 * | 6/2004 | Kauer et al. | 436/169 |
| 2005/0043600 A1 * | 2/2005 | Diab et al. | 600/344 |
| 2006/0048025 A1 * | 3/2006 | Filipovic | 714/724 |
| 2006/0173255 A1 | 8/2006 | Acosta et al. | |
| 2007/0177842 A1 * | 8/2007 | Clark | 385/52 |
| 2008/0185093 A1 * | 8/2008 | Ward et al. | 156/238 |
| 2009/0034913 A1 * | 2/2009 | Schempp et al. | 385/92 |

FOREIGN PATENT DOCUMENTS

| | | |
|---|---|---|
| EP | 0 539 007 A2 | 4/1993 |
| EP | 1 406 219 | 4/2004 |
| JP | 01-283505 | 11/1989 |
| JP | 2002-149235 | 5/2002 |
| SU | 783825 | 12/1980 |
| WO | WO 2006089800 A1 * | 8/2006 |
| WO | 2006/096210 | 9/2006 |

OTHER PUBLICATIONS

Sven Wambsganss, Martin Schwendemann: "Vollautomatisierte Kaffeeausgabe" Technikerarbeit Fachrichtung Energietechnik Und Prozessautomatisierung, May 17, 2005, XP002516873 www.technikerprojekt.de.

* cited by examiner

METHOD AND APPARATUS TO PROVIDE A DATA INTERFACE BETWEEN EQUIPMENT TO BE TEMPORARILY MONITORED AND DIAGNOSTIC DATA GATHERING APPARATUS

RELATED APPLICATION(S)

This application is related to co-pending and co-owned U.S. patent application Ser. No. 10/924,576, entitled DIAGNOSTIC DATA GATHERING APPARATUS AND METHOD and filed Aug. 24, 2004, which is incorporated by reference in its entirety herein.

TECHNICAL FIELD

This invention relates generally to the gathering of diagnostic data for monitored equipment.

BACKGROUND

The use of automated diagnostic data gathering equipment and corresponding techniques is known in the art. In some cases this includes gathering data regarding various operating states of corresponding monitored equipment such as programmable logic controllers (PLC's). A programmable logic controller comprises a digital computer used for the automation of industrial processes such as controlling machinery on factory assembly lines. Unlike general-purpose computers, PLC's have a relatively larger number of multiple inputs and output arrangements. PLC inputs serve, for example, to read limit switches, analog process variables (such as temperature and pressure), and the positions of complex positioning systems. Via outputs, PLCs operate electric motors, pneumatic or hydraulic cylinders, magnetic relays or solenoids, or analog outputs, to note but a few examples in this regard.

A data interface must typically be employed to gather such diagnostic data from such equipment. By one approach, this can comprise invasive electrical wiring to facilitate the capture of such content. In many cases, however, the equipment at issue will only be monitored in a temporary manner. This, in turn, makes invasive electrical wiring relatively cumbersome, time-consuming, and costly. This approach also often requires that the equipment to be monitored be taken off-line in order to permit a window of opportunity during which the wiring can be installed (and also later when de-installation is required). This also often necessarily requires that the industrial process being facilitated by that equipment must also be taken off-line. Such a requirement can be highly disruptive and can mitigate strongly against deploying such an approach in the first instance.

BRIEF DESCRIPTION OF THE DRAWINGS

The above needs are at least partially met through provision of the method and apparatus to provide a data interface between equipment to be temporarily monitored and diagnostic data gathering apparatus described in the following detailed description, particularly when studied in conjunction with the drawings, wherein.

Figure 1:
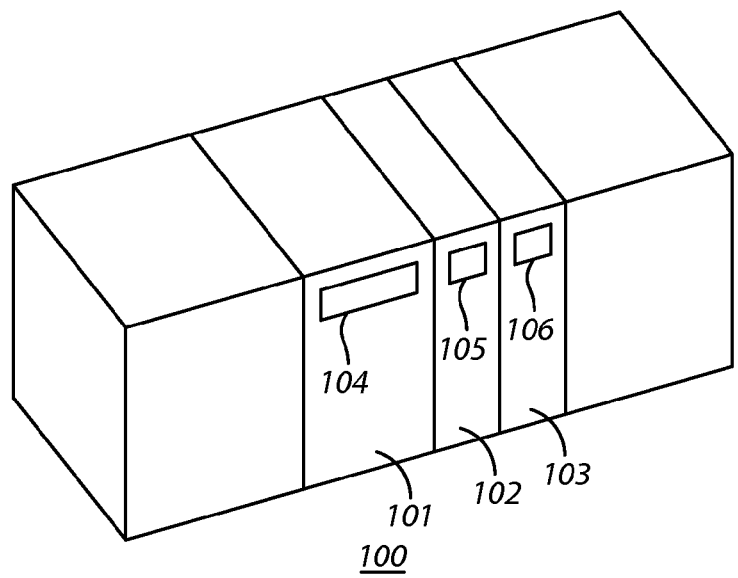
FIG. 1 comprises a perspective schematic view of equipment to be monitored as configured in accordance with the prior art.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. In other cases, relative sizing and scaling of various components and/or their various dimensions may be varied from figure to figure in order to underscore the availability of various embodiments in these regards. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above except where different specific meanings have otherwise been set forth herein.

DETAILED DESCRIPTION

Generally speaking, pursuant to these various embodiments, a channel is configured and arranged to be fixedly mounted to equipment to be temporarily monitored. At least one sensor-engagement member is movably captivated within this channel and a sensor assembly (comprising a plurality of photosensitive receptors that are disposed in a pattern that corresponds to signal lights as comprise a part of the monitored equipment) is biased towards the sensor-engagement member by an affixment member to thereby retain the sensor assembly in place with respect to the monitored equipment. By this approach, the sensor assembly (in combination with the sensor-engagement member) can be moved along the channel to a selected position with respect to at least one of the signals lights and then retained in that selected position by the affixment member.

These teachings are suitable for use with a variety of signal lights including, but not limited to, individual light emitting elements (such as Light Emitting Diodes (LED's), illuminated alphanumeric characters, and so forth. By one approach the aforementioned channel will accommodate a plurality of sensor-engagement members (and corresponding sensor assemblies) to thereby facilitate interfacing with a plurality of equipment displays at a given location.

Those skilled in the art will recognize and appreciate that these teachings are readily used and applied in conjunction with varying kinds of equipment to be monitored to thereby permit binary information as is brought to, or delivered by, such equipment to be accommodated by an appropriate interface. This can specifically include, for example, programmable logic controllers (PLC's). By optically interfacing with the equipment to be monitored in this manner, these teachings avoid invasive electrical wiring. As a result, these teachings permit such equipment to be reliably and effectively coupled to a corresponding diagnostic data gathering apparatus in a considerably shorter period of time and without necessarily requiring that the equipment be taken off-line to effect this interfacing. These teachings are readily leveraged in a manner that permits a relatively unskilled individual make an effective installation and to de-install the apparatus as well. It will also be appreciated that these teachings are highly scalable and will accommodate a wide variety of signal lights (literally from one signal light to many thousands of signal lights if desired) and physically dispersed equipment platforms.

These and other benefits may become clearer upon making a thorough review and study of the following detailed description. To begin, and referring now to FIG. 1, these teachings are applicable with a wide variety of equipment types and form factors. For the sake of illustration and not by way of limitation, the examples presented herein presume the equipment 100 to comprise a plurality of programmable logic controllers (mounted side by side, for example, in a corresponding industrial rack (not shown) in accordance with well-understood prior art practice) wherein three of the PLC's 101-103 each have corresponding signal lights 104-106.

Figure 2:
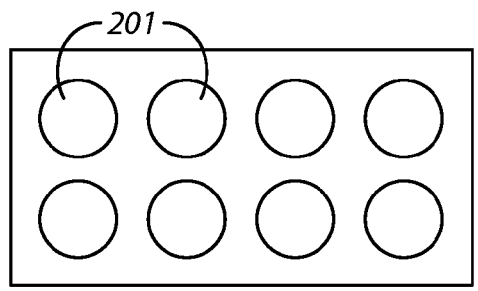
FIG. 2 comprises a front elevational schematic view as configured in accordance with the prior art.

The precise nature and form factor of these signal lights can and will vary as will be understood by those skilled in the art. As one non-limiting example in this regard, and referring now to FIG. 2, these signal lights can comprise a plurality of individual Light Emitting Diodes (LED's) 201. In such a case, the LED's 201 are often (though not always) arranged in some regular pattern. By one approach the LED's 201 may all be aligned in a single row. By another approach, and as illustrated, the LED's 201 may be arranged into multiple rows and columns. Eight LED's 201 are shown in this illustrative example. Those skilled in the art will appreciate and recognize that the use of such an example is intended to serve only as an illustrative example and is not intended to serve as an exhaustive or otherwise limiting example in this regard.

Figure 3:
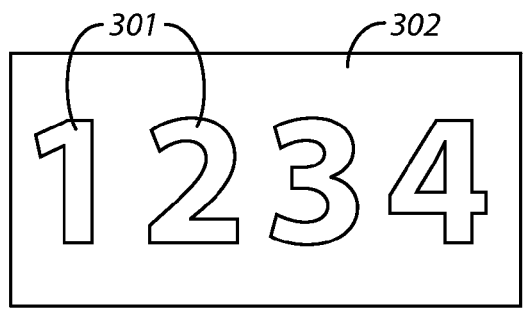
FIG. 3 comprises a front elevational schematic view as configured in accordance with the prior art.

As another example of a different signal light embodiment, and referring now to FIG. 3, these signal lights can comprise alphanumeric characters 301 (depicted in this particular example as the numbers "1," "2," "3," and "4"). By one approach, for example, the display can comprise alphanumeric characters that are defined by a light occluding mask 302. By this approach, light as sourced by a corresponding internal light element passes through the mask 302 to thereby form, via corresponding selective illumination, a respective alphanumeric character. Again, those skilled in the art will recognize that the foregoing example is intended to serve only in an illustrative capacity and is not intended to comprise an exhaustive presentation in this regard or to otherwise serve as a limitation by example.

As will be well understood by those skilled in the art, these signal lights serve to provide what essentially amounts to real-time information regarding various operating states of the corresponding PLC. This can include, but is not limited to, states pertaining to the reception of data from external feeds as well as states pertaining to output instructions and control signals. These teachings are usefully applied with respect to capturing such optical content in order to facilitate capturing information regarding the corresponding operating states for the purpose of providing such data to a diagnostic data gathering apparatus.

Figure 4:
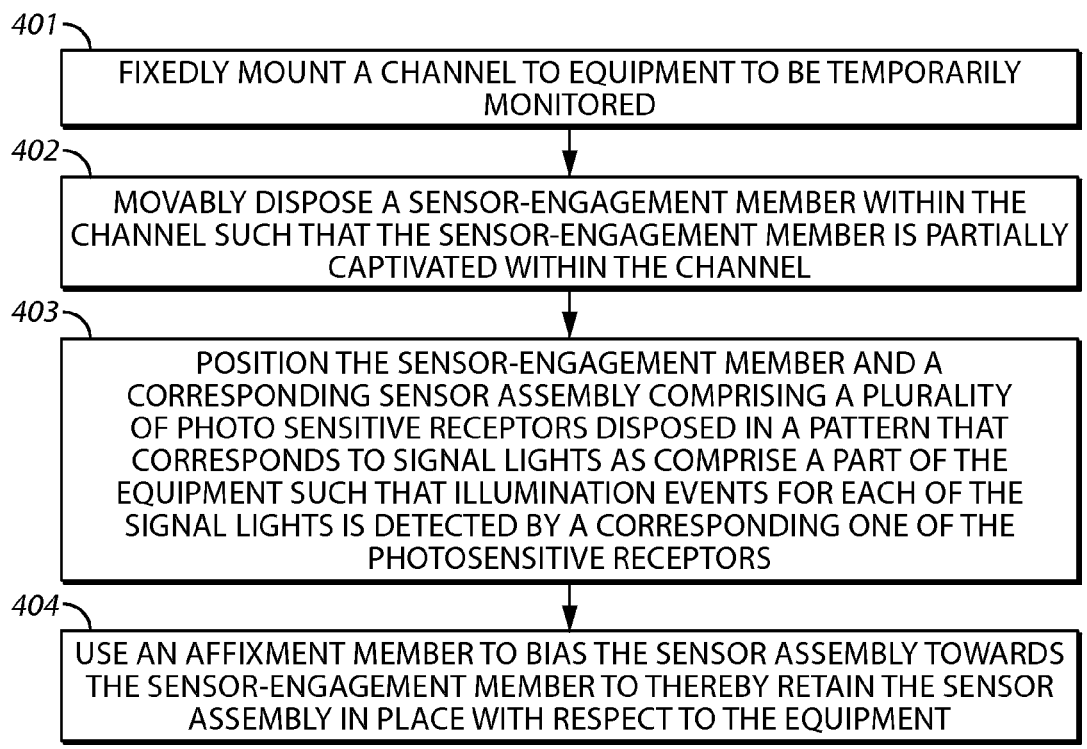
FIG. 4 comprises a flow diagram as configured in accordance with various embodiments of the invention.
Figure 5:
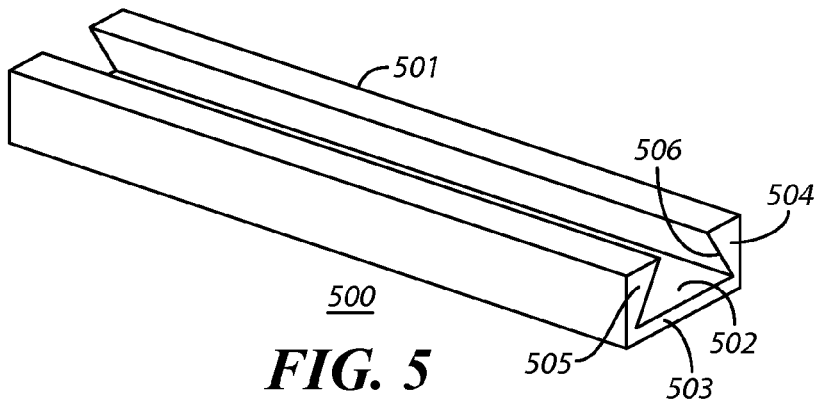
FIG. 5 comprises a perspective view as configured in accordance with various embodiments of the invention.

Referring now to the drawings, and in particular to FIG. 4, an illustrative process that is compatible with many of these teachings will now be presented. This process 400 will serve, for example, to provide a data interface between equipment 100 to be temporarily monitored and diagnostic data gather apparatus of choice. As used herein, the term "temporarily" will be understood to refer to a usage timeframe that is considerably less than the operating lifetime of the equipment itself For example, if a given item of equipment has an expected operating lifetime (assuming appropriate care and maintenance) of ten years, this temporary monitoring period might comprise, for example, a few days, a few weeks, or even a few months.

This process 400 provides for fixedly mounting 401 a channel to the equipment 100 to be monitored. Such a channel can assume various form factors. For the purposes of illustration and not by way of limitation, by one approach this channel 500 can comprise an elongate member 501 having a trough 502 formed therein. This trough 502 is bounded and formed by a bottom member 503 and two side members 504 and 505. In this example, the side members 504 and 504 have an inclined inner surface 506 to thereby form the trough 502 in the shape of a truncated triangle. As will be shown below, such a trough 502 can serve to receive a sensor-engagement member in a manner that permits the latter to move along the longitudinal axis of the channel 500 while also serving to partially captivate the sensor-engagement member by preventing it from being removed in a perpendicular direction from the trough 502.

Figure 6:
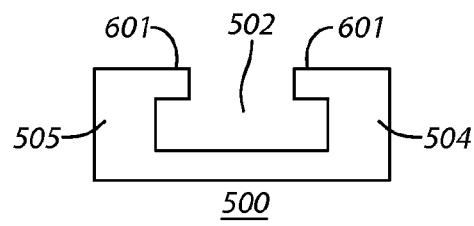
FIG. 6 comprises a side elevational view as configured in accordance with various embodiments of the invention.

This trough 502 can of course have other shapes as desired. For example, and referring momentarily to FIG. 6, each of the aforementioned side members 504 and 505 can each be provided with a cantilevered lip 601 that extends inwardly toward one another to thereby again form a trough 502 that can provide the above-described captivation functionality.

This channel 500 can have any length, width, or depth as desired. The precise dimensions may be favorably selected to accommodate the needs and/or opportunities as tend to characterize a given application setting. This channel 500 can also be comprised of any of a wide variety of materials. By one approach, this channel 500 can be comprised of a suitable metal (such as, for example, aluminum or an aluminum alloy). By another approach, this channel 500 could be comprised of a plastic of choice. Again, however, other materials (such as, for example, wood) can be employed as desired.

Figure 7:
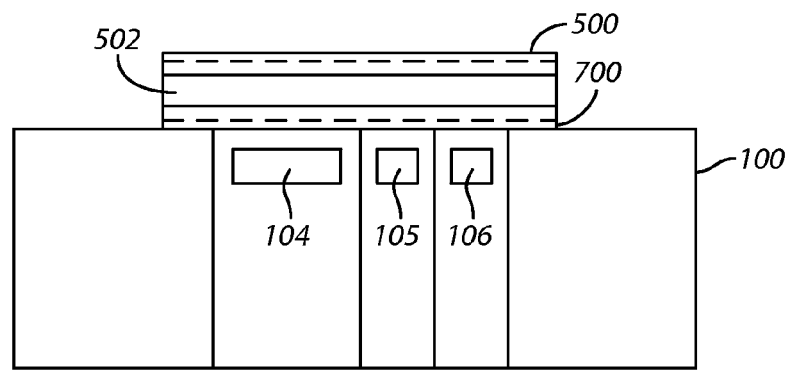
FIG. 7 comprises a front elevational view as configured in accordance with various embodiments of the invention.

Referring now momentarily to FIG. 7, this channel 700 can be fixedly mounted to the equipment 100 to be temporarily monitored using any affixment mechanism of choice. By one approach, and as illustrated, this can comprise using an adhesive tape 700 such as, for example, a double-side adhesive tape as is known in the art. Other affixment mechanisms could be employed as well including other adhesive-based approaches, screws or bolts, clamps of various kinds, magnetic forces, and so forth. It would even be possible to form this channel 500 as a permanent part of the equipment 100 such that the channel 500 comprises a permanent part of the equipment 100.

By one approach, this step of fixedly mounting the channel 500 to the equipment 100 comprises positioning the channel 500 to be proximal to the equipment's displays 104-106. In particular, and as shown, this can comprise disposing the channel 500 such that the aforementioned trough 502 is at least partially co-extensive with the displays of choice. Such a placement will permit, in turn, appropriate placement of the sensor-engagement member/sensory assembly with respect to these displays.

The embodiment illustrated depicts only a single channel 500 being used with three separate displays 104-106. Additional channels can be employed as desired, with each channel being deployed with as many, or as few, corresponding displays as desired. By one approach such multiple channels can be disposed in an axially aligned and contiguous manner so that they collectively form a single common trough. By another approach they can be disposed physically apart from one another to form a corresponding plurality of segregated troughs.

Figure 8:
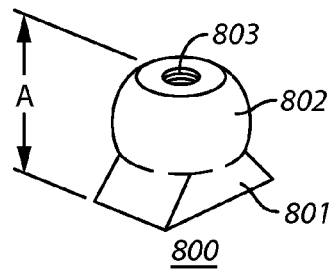
FIG. 8 comprises a perspective view as configured in accordance with various embodiments of the invention.
Figure 9:
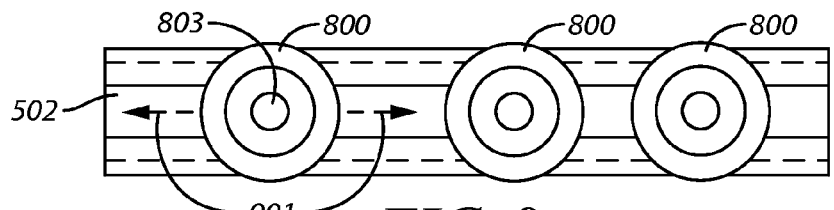
FIG. 9 comprises a front elevational view as configured in accordance with various embodiments of the invention.

Referring now to FIGS. 1, 8, and 9, this process 400 then provides for movably disposing 402 at least one sensor-engagement member 800 within the channel 502 such that the sensor-engagement member(s) 800 is partially (i.e., not fully) captivated within the channel 502. By one approach, to facilitate this step, the sensor-engagement member 800 can have a base 801 having a form factor that snuggly (though not too tightly) conforms to the shape of the channel trough 502.

By this approach, the sensor-engagement member base 801 can be introduced into the channel trough 502 from the side of the channel 500 and then slid along the longitudinal axis of the channel trough 502 as suggested by the phantom arrows 901 in FIG. 9. So configured, a sensor-engagement member 800 can be slid along the channel 500 to a desired location but is otherwise captivated in that it cannot be removed from the channel trough 502 except by moving the sensor-engagement member 800 to an end of the channel 500 where it can be slid free of the channel trough 502.

As illustrated in this example, the sensor-engagement member 800 also has a pad 802 attached to the base 801. The pad 802 can have essentially any shape and has dimensions that are suitable to later aid in correctly positioning a corresponding sensor assembly with respect to the aforementioned equipment. For example, the dimension denoted by the letter "A" in FIG. 8 can be selected to properly position a given sensor assembly in this manner for a specific corresponding piece of equipment. (These teachings will also accommodate, if desired, the use of additional spacers to provide for some flexibility with respect to this dimension "A" if desired.)

This sensor-engagement member 800 can be comprised of any suitable material including metal, plastic, or the like. By one approach this component can comprise an integral assembly (where, for example, the entire component has been formed of plastic using a single mold). This sensor-engagement member 800 also has, by one approach, a threaded opening 803 formed in at least the pad 802. This threaded opening 803 serves to receive an affixment member as described below.

Figure 10:
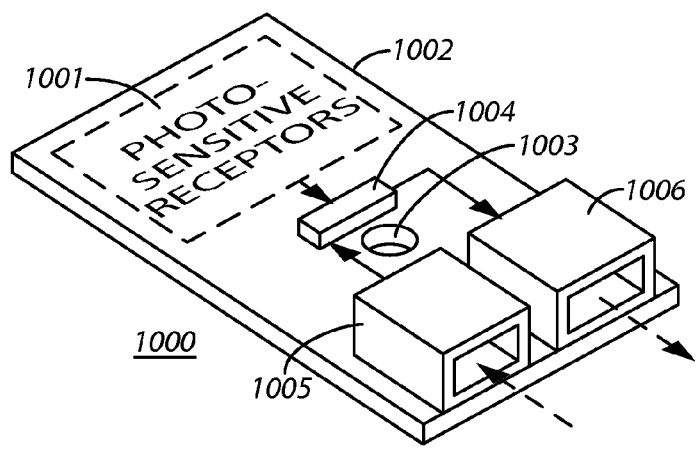
FIG. 10 comprises a perspective view as configured in accordance with various embodiments of the invention.

Referring now to FIGS. 1 and 10, this process 400 then provides for positioning 403 the sensor-engagement member 800 and a corresponding sensor assembly 1000 in a particular manner with respect to the equipment 100 to be temporarily monitored. Prior to describing this step in more detail, however, it may be appropriate to first provide more details with respect to the sensor assembly 1000 itself.

As shown in FIG. 10, the sensor assembly 1000 has one or more photosensitive receptors 1001. By one approach these photosensitive receptors 1001 comprise semiconductors that respond to light by outputting a corresponding electrical signal. Numerous examples exist in this regard and are well known to those skilled in the art. As these teachings are not particularly sensitive to any particular selections in this regard, for the sake of brevity further elaboration in this regard will not be provided here.

These photosensitive receptors 1001 can be disposed on a printed wiring board 1002 in accordance with well understood prior art technique. This printed wiring board 1002 can also have a hole 1003 disposed therethrough to receive the attachment member described below and can also serve to support other circuitry as may be useful or necessary to facilitate desired functionality. For example, by one approach, the sensor assembly 1000 can further comprise a processor 1004 that operably couples to the photosensitive receptors 1001 and which is configured and arranged to facilitate detection of illumination events as correspond to the equipment's signal lights. Those skilled in the art will recognize and appreciate that such a processor can comprise a fixed-purpose hard-wired platform or can comprise a partially or wholly programmable platform. All of these architectural options are well known and understood in the art and require no further description here.

Figure 11:
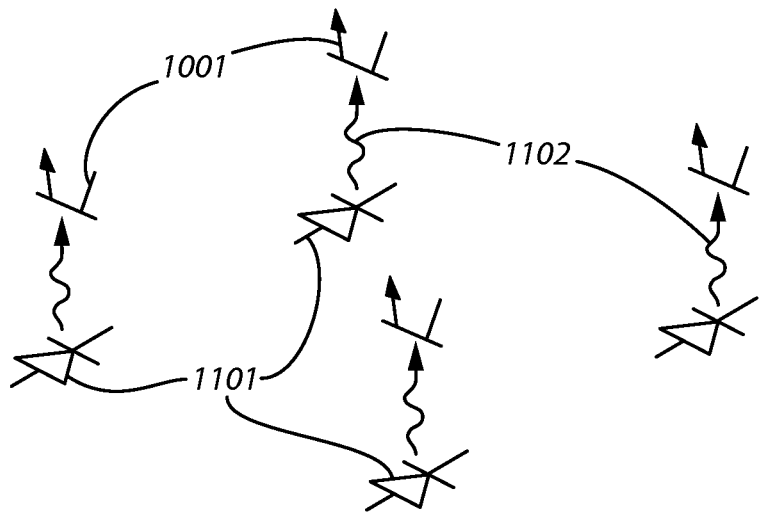
FIG. 11 comprises a perspective schematic view as configured in accordance with various embodiments of the invention.

By one approach, and referring momentarily to FIG. 11, these photosensitive receptors 1001 are arranged in a pattern that corresponds to the signal lights 1101 of the equipment to be temporarily monitored. Such a pattern can provide for aligning a given photosensitive receptor with a given signal light such that illumination events 1102 for each of the signal lights is detected by a corresponding one of the plurality of photosensitive receptors. By one approach this can comprise a one-to-one alignment pattern. Other possibilities could be considered. For example, by another approach, two photosensitive receptors could be positioned to each respond to a single opposing signal light. (In the illustrated example provided, the signal lights 1101 are LED's and there are a same number of photosensitive receptors 1001 as there are signal lights 1101; again, this example is intended to serve only in a non-limiting illustrative capacity. It will also be recalled that such an arrangement can be used as well when the signal lights comprise illuminated alphanumeric characters as were described above.)

Referring again to FIG. 10, the sensor-engagement member 1000 can also comprise an input interface 1005 and an output interface 1006. These interfaces 1005 and 1006 can comprise, for example, RJ-16 style connectors (which often feature six electrical conductors) to facilitate connection to an Ethernet-styled network. As those skilled in the art will recognize and understand, however, any number of interfaces will serve in this capacity. A specific selection in this regard will depend in many cases upon other needs and/or opportunities as may tend to characterize a given application setting. Generally speaking, for many application purposes, these interfaces can have a sufficient number of electrical conductors to permit a two-way exchange of information, a supply of power, and such other overhead capabilities as may be useful or necessary in a given application setting.

Figure 13:
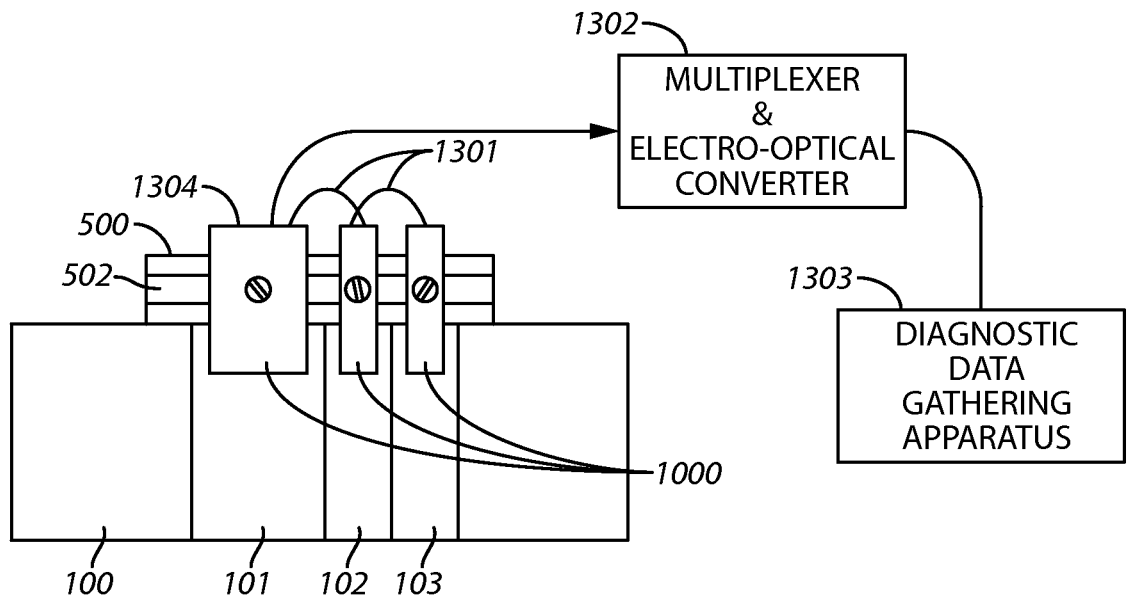
FIG. 13 comprises a front elevational schematic and block diagram view as configured in accordance with various embodiments of the invention.

These interfaces 1005 and 1006 are operably coupled to the processor 1004 and serve to facilitate the transmission of data regarding detecting illumination events as are sensed by the photosensitive receptors 1001. As shown in FIG. 13, such interfaces 1005 and 1006 can also serve to facilitate daisy-chaining multiple ones of the sensor assemblies 1000 to one another via an interconnecting communication medium 1301 (such as optical cable, Ethernet cable, or the like). As will be illustrated momentarily, these interfaces 1005 and 1006 can also be positioned to aid in locating the sensor assembly 1000 in a selected position with respect to the channel 500.

Figure 12:
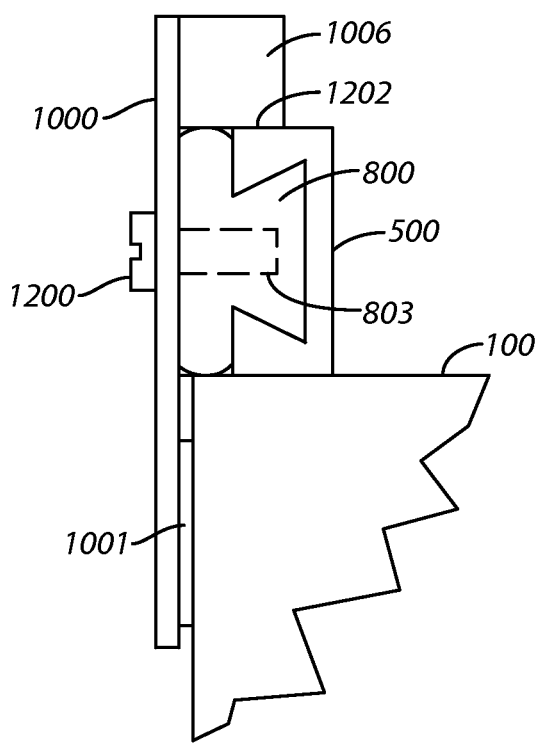
FIG. 12 comprises a side elevational detail view as configured in accordance with various embodiments of the invention.

Referring now more specifically to FIG. 12, the sensor assembly 1000 can be loosely connected to a corresponding sensor-engagement member 800 by use of an affixment member 1200 (comprising, in this illustrative example, a threaded member that threadably interacts with the threaded opening 803 provided in the sensor-engagement member 800). At this point, this can comprise, as noted, a relatively loose connection to thereby facilitate easily moving the sensor-engagement member 800/sensor assembly 1000 along the channel 500 to a desired location.

It may also be noted that, if desired and as illustrated, the dimensions of the various components can be selected such that, when properly located, the input/output interfaces (with the output interface 1006 being visible in FIG. 12) can abut 1202 the channel 500. This, in turn, can aid in assuring a proper installation of these elements with respect to a given item of equipment to be monitored.

Referring now more specifically to FIG. 13, the combined sensor-engagement member 800/sensor assemblies 1000 can be moved along the channel 500 to thereby place each sensor assembly 1000 in such a way as to align the photosensitive receptors 1001 with the corresponding signal lights of the displays of the equipment 100 to be temporarily monitored. Upon achieving this alignment, and as set forth in FIG. 1, the affixment member can then be used 404 and manipulated to bias the sensor assembly 1000 towards the corresponding sensor-engagement member 800 to thereby retain the sensor assembly in place with respect to the equipment 100.

Once positioned in this manner, the various sensor assemblies 1000 can then be daisychained as desired and further coupled to a multiplexer and electro-optical converter 1302 that operably couples to the sensor assemblies 1000 in this manner to receive their corresponding data regarding the equipment's illumination events. By one approach, the multiplexer and electro-optical converter can be self sufficient by relying upon an internal power source (such as a battery). Using this approach, these teachings can be implemented without requiring an external power source for any of the interface components. This, in turn, can further contribute to the ease by which such an apparatus can be deployed or uninstalled in a given application setting.

The multiplexer and electro-optical converter 1302 can then couple via an optical conduit to a diagnostic data gathering apparatus 1303 of choice to thereby carry optically-born data regarding the illumination events to the latter. Those skilled in the art will understand that many such diagnostic data gathering apparatuses do not necessarily have a native ability to compatibly receive optically-encoded data. In such a case, an intervening receiving component (not shown, but typically physically located relatively close to the diagnostic data gathering apparatus) can serve to receive the optical information and then process that optical information to provide the substantive information in a compatible form to the diagnostic data gathering apparatus. Such processing can comprise, for example, receiving and decoding the optical information, demultiplexing that information, converting that information into electrical signals that are compatible with the diagnostic data gathering apparatus, and so forth.

As suggested by the illustration provided in FIG. 13, the various sensor assemblies 1000 can have differing dimensions and form factors from one another if desired. This can serve to accommodate, for example, the display form factors as correspond to various items of equipment. As illustrated, for example, one of the PLC's 101 has a wider display area (as shown in FIG. 1) and hence the corresponding sensor assembly 1304 has a wider form factor as well to thereby accommodate a corresponding number and placement of photosensitive receptors.

Those skilled in the art will recognize and appreciate that such a system can be readily uninstalled as well. This can comprise simply loosening the aforementioned affixment member 1200 to permit the various sensor assemblies/sensor-engagement members to be moved along the channel 500 to permit the former to be easily disengaged from the latter. The channel 500 itself can be removed from the equipment 100 if desired. Or, if desired, the channel 500 can be left in place. The latter can be preferable in some application settings. As the channel 500 will typically comprise a relatively low cost item and will not otherwise interfere with the operation of the equipment 100, leaving the channel 500 in place will further facilitate re-installing the data interface components should such ever be desired in the future.

It will of course be further understood and appreciated that the diagnostic data gathering apparatus 1303 can receive diagnostic data from more than one such multiplexer and electro-optical converter 1302 to thereby accommodate a large number of items of equipment, including items of equipment that are located at a considerable distance from one another. Using an optical conduit as suggested, for example, one can readily expect to position the diagnostic data gathering apparatus at up to 100 meters from each such multiplexer and electro-optical converter and still anticipate successful operation of the system.

So configured and arranged, these teachings facilitate greatly easing the task of installing and de-installing data connections to gather operational state data from equipment to be temporarily monitored. In many cases a proper and effective installation can be achieved with only normally-skilled individuals as versus diagnostic data gathering experts. Those skilled in the art will recognize and appreciate that these teachings provide for a completely non-invasive data gathering interface that requires no electrical rewiring of the equipment. The applicant has also observed and determined that these teachings provide for a very rapid deployment and re-deployment of the described components and actions. For example, such an approach can mean a difference of many hours or even days as compared to invasive rewiring requirements.

It will also be observed that these teachings are highly flexible and leverageable. Accordingly, these teachings are readily applied in conjunction with a wide variety of equipment to be monitored including essentially all PLC's. Being easily and effectively deployed, these teachings are also suitable for use in application settings where various items of equipment to be monitored are located at considerable distances from one another (such as, for example, dozens of meters apart) and where only a single diagnostic data gathering apparatus serves to receive data from all of these items of equipment.

Figure 14:
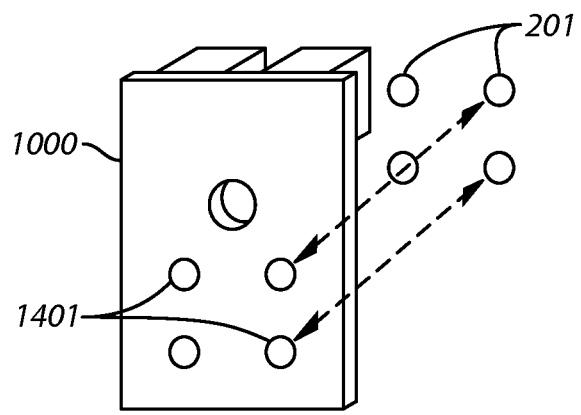
FIG. 14 comprises a perspective schematic view as configured in accordance with various embodiments of the invention.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept. As but one illustrative example in this regard, and referring now to FIG. 14, the aforementioned sensor assembly 1000 can be further provided with a plurality of LED's 1401 that are externally disposed to permit an onlooker to readily observe the illumination state of these LED's 1401. The aforementioned processor 1004 can then operably couple to these LED's 1401 and can be configured and arranged to cause these externally exposed light emitting elements to illuminate in a manner that mirrors the illumination events of the corresponding equipment signal lights 201. This, in turn, serves to render these illumination events visible to an observer notwithstanding that these illumination events are otherwise occluded by the sensor assembly 1000. When using a receiving component as suggested above, it would also be possible to mirror various PLC signal lights at the receiving component in an analogous manner.

I claim:

1. An apparatus configured and arranged to provide a data interface between equipment, having a plurality of signal lights, to be temporarily monitored and a diagnostic data gathering apparatus, comprising:
   a channel configured and arranged to be fixedly mounted to the equipment to be temporarily monitored;
   at least one sensor-engagement member movably captivated within the channel such that the sensor-engagement member moves laterally with respect to the signal lights;
   a sensor assembly comprising a plurality of photosensitive receptors disposed in a pattern that corresponds to at least two of the plurality of signal lights as comprise a part of the equipment to be temporarily monitored such that illumination events for each of the at least two of the plurality of signal lights is detected by a corresponding one of the plurality of photosensitive receptors;
   an affixment member configured and arranged to bias the sensor assembly towards the at least one sensor-engagement member to thereby retain the sensor assembly in place with respect to the equipment to be temporarily monitored;
   such that the sensor assembly, in combination with a corresponding one of the at least one sensor-engagement member, can be moved along the channel to a selected lateral position with respect to at least one of the signal lights and then retained in the selected position by the affixment member.

2. The apparatus of claim 1 wherein the equipment to be temporarily monitored comprises a Programmable Logic Controller (PLC).

3. The apparatus of claim 2 wherein the equipment to be temporarily monitored comprises at least two Programmable Logic Controllers (PLC's).

4. The apparatus of claim 1 further comprising:
   an adhesive tape for disposition between the channel and the equipment to be temporarily monitored to thereby secure the channel to the equipment to be temporarily monitored.

5. The apparatus of claim 1 wherein the plurality of signal lights comprise individual Light Emitting Diodes (LED's) and wherein the sensor assembly comprises a same number of photosensitive receptors as there are signal lights in a segregated component area of the equipment to be temporarily monitored.

6. The apparatus of claim 1 wherein the signal lights comprise alphanumeric characters.

7. The apparatus of claim 6 wherein the alphanumeric characters comprise alphanumeric characters that are defined by a light occluding mask such that light passing through the mask forms the alphanumeric characters.

8. The apparatus of claim 1 wherein the sensor assembly comprises a plurality of the sensor assemblies that are each configured and arranged to share the channel.

9. The apparatus of claim 1 wherein the sensor assembly comprises a processor that is operably coupled to the plurality of photosensitive receptors and that is configured and arranged to facilitate detection of the illumination events.

10. The apparatus of claim 9 further comprising an input interface and an output interface, both of which are operably coupled to the processor, to thereby facilitate a transmission of data regarding detected illumination events and to further facilitate daisy-chaining multiple ones of the sensor assemblies to one another.

11. The apparatus of claim 10 wherein the input interface and the output interface are positioned to aid in locating the sensor assembly in the selected position.

12. The apparatus of claim 1 further comprising:
   a multiplexer and electro-optical converter that operably couples to the sensor assembly.

13. The apparatus of claim 12 further comprising:
   an optical conduit coupled to the multiplexer and electro-optical converter and the diagnostic data gathering apparatus to carry optically-born data regarding the illumination events to the diagnostic data gathering apparatus.

14. The apparatus of claim 1 wherein the sensor assembly comprises:
   externally exposed light emitting elements; and
   a driver operably coupled to the externally exposed light emitting elements and being configured and arranged to cause the externally exposed light emitting elements to illuminate in a manner that mirrors the illumination events to thereby render those illumination events visible to an observer notwithstanding those illumination events being occluded by the sensor assembly.

15. A method to provide a data interface between equipment to be temporarily monitored and diagnostic data gathering apparatus, comprising:
   fixedly mounting a channel to the equipment to be temporarily monitored;
   movably disposing at least one sensor-engagement member within the channel such that the at least one sensor-engagement member is partially captivated within the channel;
   positioning the at least one sensor-engagement member and a corresponding sensor assembly comprising a plurality of photosensitive receptors disposed in a pattern that corresponds to signal lights that comprise a part of the equipment to be temporarily monitored such that illumination events for each of the signal lights is detected by a corresponding one of the plurality of photosensitive receptors;
   using an affixment member to bias the sensor assembly towards the at least one sensor-engagement member to thereby retain the sensor assembly in place with respect to the equipment to be temporarily monitored.

16. The method of claim 15 wherein the equipment to be temporarily monitored comprises a Programmable Logic Controller (PLC).

17. The method of claim 16 wherein the equipment to be temporarily monitored comprises at least two Programmable Logic Controllers (PLC's).

18. The method of claim 15 wherein fixedly mounting the channel to the equipment comprises using adhesive tape to secure the channel to the equipment to be temporarily monitored.

19. The method of claim 15 wherein the signal lights comprise individual Light Emitting Diodes (LED's) and wherein the sensor assembly comprises a same number of photosensitive receptors as there are signal lights in a segregated component area of the equipment to be temporarily monitored.

20. The method of claim 15 wherein the sensor assembly comprises a plurality of the sensor assemblies that are each configured and arranged to share the channel.

21. The method of claim 15 wherein the sensor assembly comprises an input interface and an output interface and wherein positioning the at least one sensor-engagement member and a corresponding sensor assembly comprises using the input interface and the output interface to aid in locating the sensor assembly in the selected position.

\* \* \* \* \*